US009653498B2

(12) United States Patent
Yamashita et al.

(10) Patent No.: US 9,653,498 B2
(45) Date of Patent: May 16, 2017

(54) IMAGING DEVICE HAVING ELECTRODE OVERLYING PHOTOELECTRIC CONVERSION LAYER AND HAVING ELECTRICAL CONTACT TO ELECTRODE

(71) Applicant: CANON KABUSHIKI KAISHA, Tokyo (JP)

(72) Inventors: Takanori Yamashita, Hachioji (JP); Seiji Hashimoto, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/188,009

(22) Filed: Jun. 21, 2016

(65) Prior Publication Data

US 2016/0300878 A1    Oct. 13, 2016

Related U.S. Application Data

(63) Continuation of application No. 14/748,458, filed on Jun. 24, 2015, now Pat. No. 9,502,451.

(30) Foreign Application Priority Data

Jul. 30, 2014    (JP) .................................. 2014-154431

(51) Int. Cl.
    *H01L 27/146*    (2006.01)
    *H01L 31/0352*    (2006.01)

(52) U.S. Cl.
    CPC .. *H01L 27/14603* (2013.01); *H01L 27/14609* (2013.01); *H01L 27/14612* (2013.01);

(Continued)

(58) Field of Classification Search
    CPC ......... H01L 27/14603; H01L 27/14609; H01L 27/14636; H01L 27/14643;
(Continued)

(56) References Cited

U.S. PATENT DOCUMENTS

| 4,731,665 A | 3/1988 | Hashimoto et al. |
| 4,959,723 A | 9/1990 | Hashimoto |

(Continued)

FOREIGN PATENT DOCUMENTS

| JP | 2011-249677 | 12/2011 |
| JP | 2013-140987 | 7/2013 |

*Primary Examiner* — Stephen W Smoot
(74) *Attorney, Agent, or Firm* — Fitzpatrick, Cella, Harper & Scinto

(57) ABSTRACT

An imaging device includes a plurality of pixels arranged in a pixel region, each of the plurality of pixels including a photoelectric conversion element including a first electrode provided above a substrate, a second electrode provided above the first electrode and a photoelectric conversion layer provided between the first electrode and the second electrode, an interconnection layer provided between the substrate and the first electrode, the interconnection layer including a first conductive member extending in a first direction, and a second conductive member arranged at a level lower than the first conductive member and extending in a second direction intersecting the first direction, a first contact portion provided in the pixel region, the first contact portion electrically connecting the second electrode and the first conductive member, and a second contact portion electrically connecting the first conductive member and the second conductive member.

20 Claims, 10 Drawing Sheets

(52) U.S. Cl.
CPC .. *H01L 27/14621* (2013.01); *H01L 27/14627* (2013.01); *H01L 27/14636* (2013.01); *H01L 27/14643* (2013.01); *H01L 27/14645* (2013.01); *H01L 27/14667* (2013.01); *H01L 31/035218* (2013.01)

(58) Field of Classification Search
CPC ......... H01L 27/14645; H01L 27/14665; H01L 27/14667
See application file for complete search history.

(56) References Cited

U.S. PATENT DOCUMENTS

| | | |
|---|---|---|
| 4,962,412 A | 10/1990 | Shinohara et al. |
| 5,146,339 A | 9/1992 | Shinohara et al. |
| 5,283,428 A | 2/1994 | Morishita et al. |
| 7,019,373 B2 | 3/2006 | Hashimoto |
| 7,859,575 B2 | 12/2010 | Ota et al. |
| 7,903,056 B2 | 3/2011 | Kawasaki et al. |
| 8,189,086 B2 | 5/2012 | Hashimoto et al. |
| 8,310,576 B2 | 11/2012 | Hashimoto et al. |
| 8,928,789 B2 | 1/2015 | Hashimoto et al. |
| 9,019,141 B2 | 4/2015 | Hashimoto et al. |
| 9,049,389 B2 | 6/2015 | Hashimoto et al. |
| 9,159,750 B2 | 10/2015 | Ikeda et al. |
| 2003/0025815 A1 | 2/2003 | Hashimoto |
| 2005/0205901 A1 | 9/2005 | Suzuki |
| 2007/0170478 A1 | 7/2007 | Araki |
| 2009/0218646 A1 | 9/2009 | Okada |
| 2010/0079650 A1 | 4/2010 | Goto |
| 2010/0321532 A1 | 12/2010 | Hashimoto et al. |
| 2011/0298023 A1 | 12/2011 | Ohguro |
| 2013/0113060 A1 | 5/2013 | Matsunaga |
| 2013/0228673 A1 | 9/2013 | Hashimoto et al. |
| 2013/0277536 A1 | 10/2013 | Mizuno et al. |
| 2015/0062394 A1 | 3/2015 | Ikeda et al. |
| 2015/0137199 A1 | 5/2015 | Mori et al. |
| 2016/0006967 A1 | 1/2016 | Yamashita et al. |

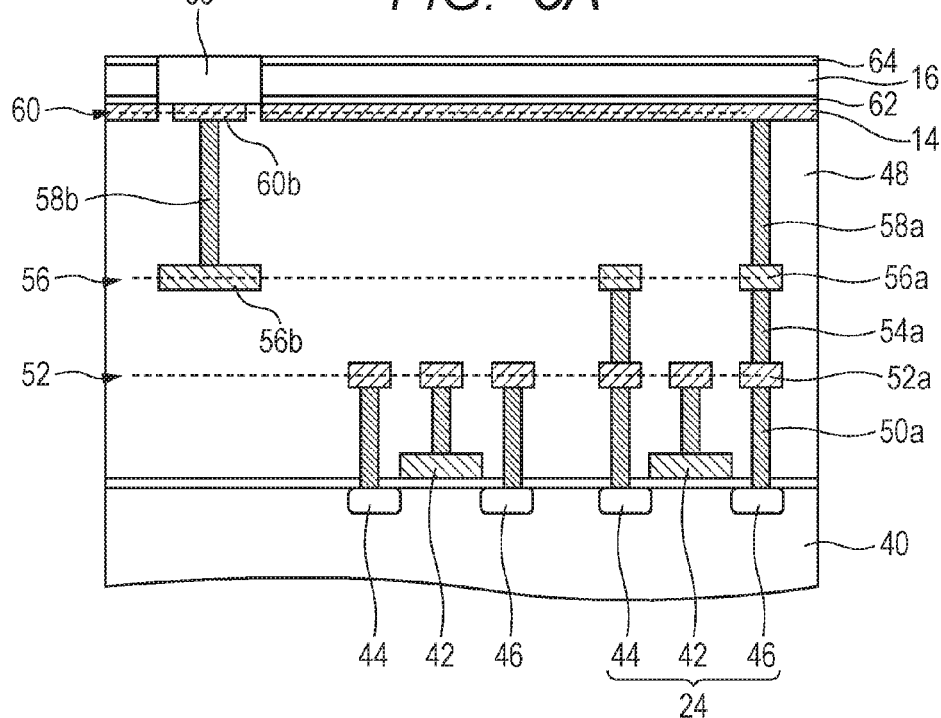
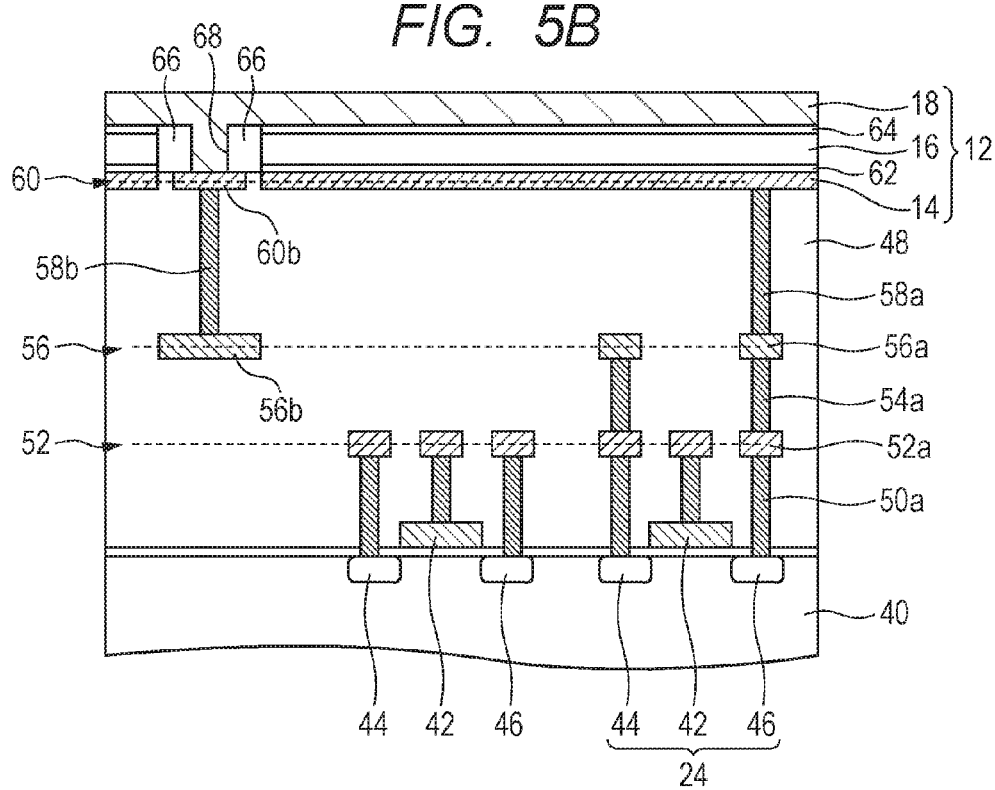

IMAGING DEVICE HAVING ELECTRODE OVERLYING PHOTOELECTRIC CONVERSION LAYER AND HAVING ELECTRICAL CONTACT TO ELECTRODE

This application is a Continuation of application Ser. No. 14/748,458 filed Jun. 24, 2015 now U.S. Pat. No. 9,502,451.

BACKGROUND OF THE INVENTION

Field of the Invention

The present invention relates to an imaging device and an imaging system.

Description of the Related Art

A stacked imaging device is known, the device including photoelectric conversion elements stacked on a semiconductor substrate, the each elements including pixel electrode, photoelectric conversion layer and common electrode formed in this order. Japanese Patent Application Laid-Open No. 2011-249677 describes a configuration of reducing the impedance of the common electrode by forming a conductive film on the common electrode in order to reduce a signal output difference between near the center and near the periphery of an imaging region caused by resistance values of the common electrode of photoelectric conversion elements.

In the imaging device described in Japanese Patent Application Laid-Open No. 2011-249677, a grid-like or matrix-like conductive film is formed on the photoelectric conversion elements. The conductive film may block light or reduce the transmittance of light, and the sensitivity of incident light may be reduced if the area of the conductive film is increased. Therefore, increasing the area of the conductive film is difficult in the imaging device described in Japanese Patent Application Laid-Open No. 2011-249677, and sufficiently reducing the impedance of the common electrode is difficult. As a result, a signal output difference may be generated between near the center and the near the periphery of the imaging region, and the image quality may be deteriorated.

SUMMARY OF THE INVENTION

An object of the present invention is to provide an imaging device that can improve image quality without reducing sensitivity.

According to one aspect of the present invention, there is provided an imaging device including a plurality of pixels arranged in a pixel region, each of the plurality of pixels including a photoelectric conversion element including a first electrode provided above a substrate, a second electrode provided above the first electrode and a photoelectric conversion layer provided between the first electrode and a second electrode, an interconnection layer provided between the substrate and the first electrode, the interconnection layer including a first conductive member extending in a first direction, and a second conductive member provided at a level lower than the first conductive member and extending in a second direction intersecting the first direction, a first contact portion provided in the pixel region, the first contact portion electrically connecting the second electrode and the first conductive member, and a second contact portion electrically connecting the first conductive member and the second conductive member.

According to another aspect of the present invention, there is provided an imaging device including a plurality of pixels arranged in a pixel region, each of the plurality of pixels including a photoelectric conversion element including a first electrode provided above a substrate, a second electrode provided above the first electrode and a photoelectric conversion layer provided between the first electrode and a second electrode, and each of the plurality of pixels including an amplifier circuit connected to the second electrode, wherein the amplifier circuit supplies a voltage to the second electrode of the corresponding pixel of the plurality of pixels.

Further features of the present invention will become apparent from the following description of exemplary embodiments with reference to the attached drawings.

BRIEF DESCRIPTION OF THE DRAWINGS

FIGS. 4A, 4B, 5A and 5B are schematic cross-sectional views illustrating a method of manufacturing the imaging device according to the first embodiment of the present invention.

DESCRIPTION OF THE EMBODIMENTS

Preferred Embodiments of the Present Invention will now be described in detail in accordance with the accompanying drawings.

First Embodiment

An imaging device according to a first embodiment of the present invention will be described with reference to FIGS. 1 to 5B.

Figure 1:
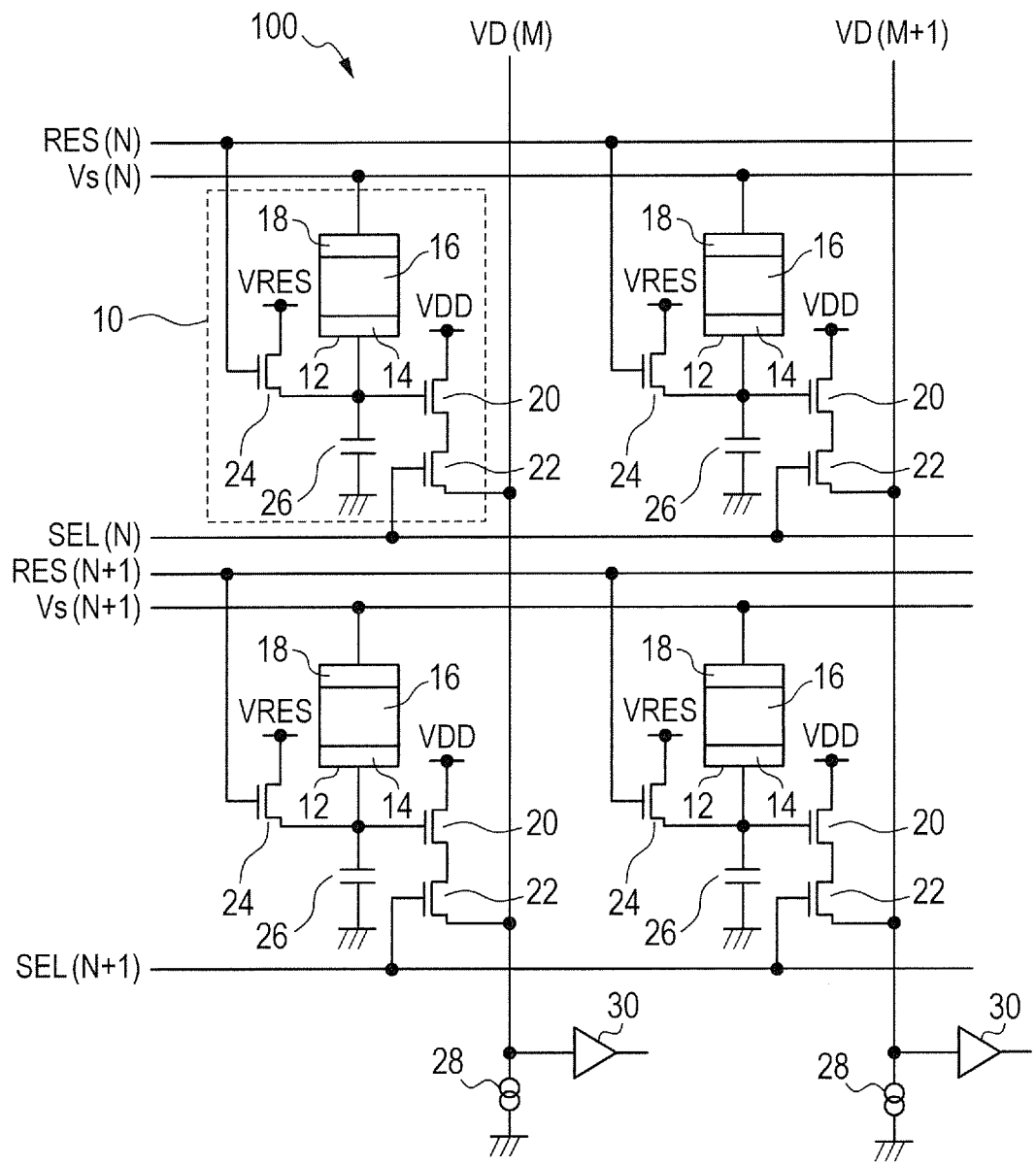
FIG. 1 is a circuit diagram illustrating a pixel configuration of an imaging device according to a first embodiment of the present invention.
Figure 2:
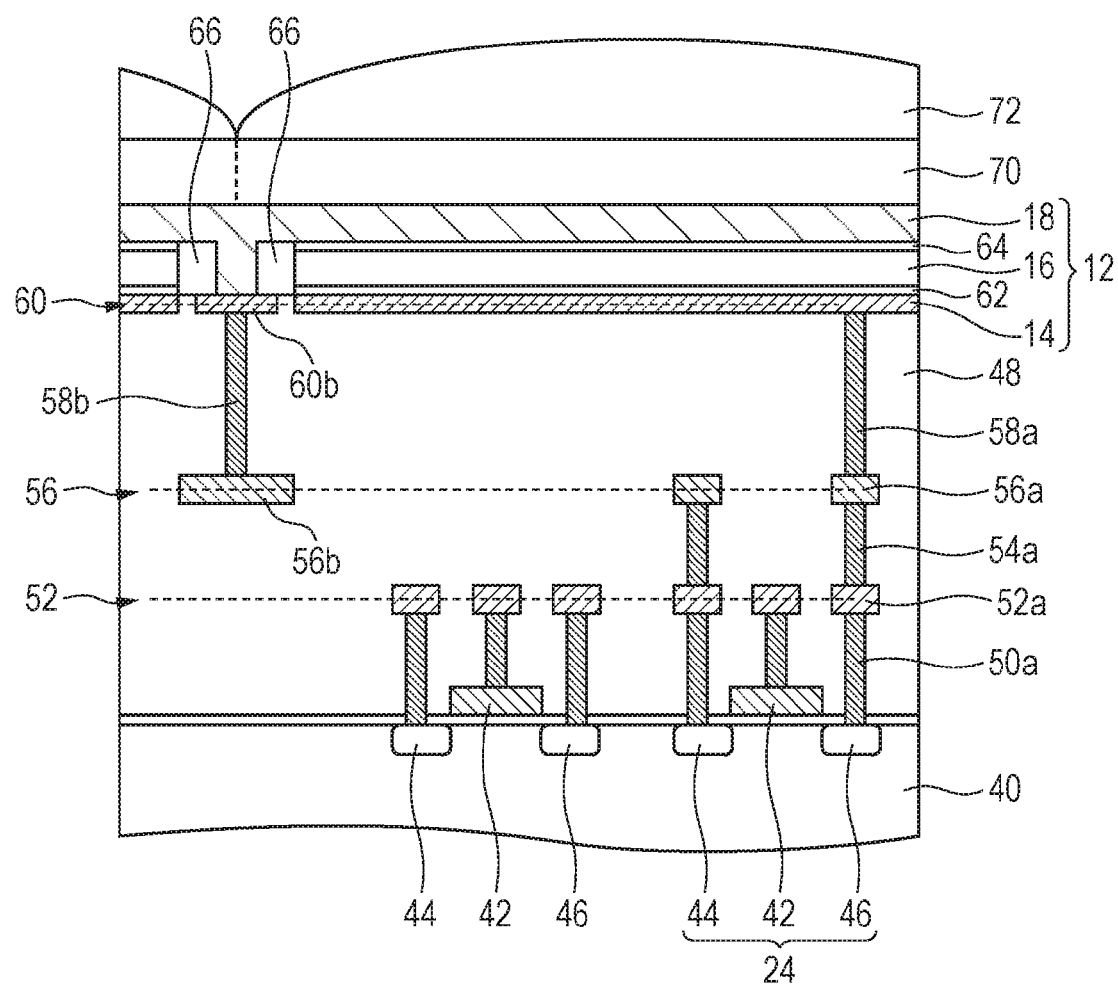
FIG. 2 is a schematic cross-sectional view illustrating a structure of the imaging device according to the first embodiment of the present invention.
Figure 3:
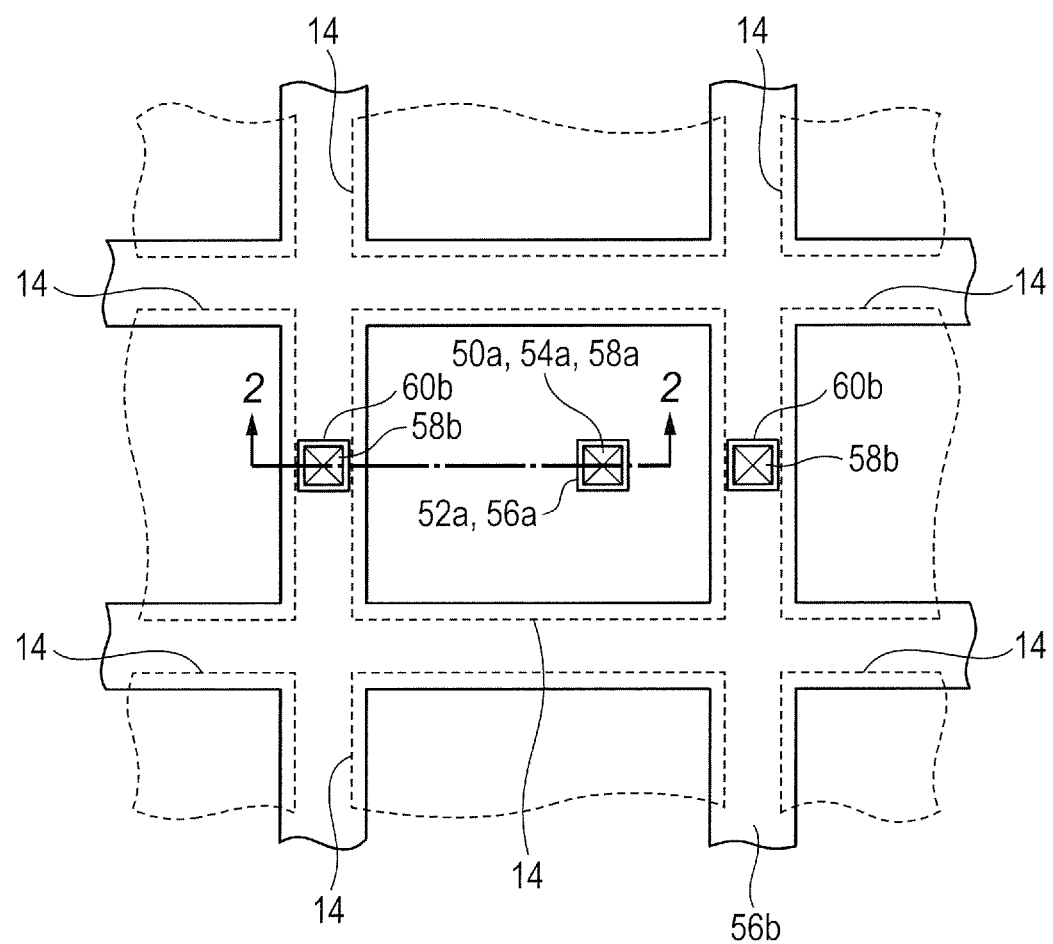
FIG. 3 is a plan view schematically illustrating the structure of the imaging device according to the first embodiment of the present invention.

FIG. 1 is a circuit diagram illustrating a pixel configuration of the imaging device according to the present embodiment. FIG. 2 is a schematic cross-sectional view illustrating a structure of the imaging device according to the present embodiment. FIG. 3 is a plan view schematically illustrating the structure of the imaging device according to the present embodiment. FIGS. 4A to 5B are schematic cross-sectional views illustrating a method of manufacturing the imaging device according to the present embodiment.

First, the pixel configuration of the imaging device according to the present embodiment will be described with reference to FIG. 1.

As illustrated in FIG. 1, an imaging device 100 according to the present embodiment includes a plurality of pixels 10 provided in a pixel region. The plurality of pixels 10 is arranged in a first direction and a second direction intersecting the first direction. The plurality of pixels 10 may be arranged in a two-dimensional matrix including a plurality of rows and a plurality of columns to form a pixel array. Although FIG. 1 illustrates a pixel array of 2 rows×2 columns including an N-th row, an (N+1)-th row, an M-th column and an (M+1)-th column for the simplification of the drawing, the number of rows and the number of columns of the pixel array are not limited to these. The first direction is, for example, a row direction, and the second direction is, for example, a column direction. In the present specification, the row direction denotes a transverse direction in FIG. 1, and the column direction denotes a longitudinal direction in FIG. 1. In an example, the row direction corresponds to a horizontal direction in the imaging device, and the column direction corresponds to a vertical direction in the imaging device.

Each of the pixels 10 includes a photoelectric conversion element 12, an amplifier transistor 20, a select transistor 22, a reset transistor 24 and a capacitor 26. The photoelectric conversion element 12 includes a first electrode 14, a photoelectric conversion layer 16 and a second electrode 18.

The first electrode 14 of the photoelectric conversion element 12 is connected to a first terminal of the reset transistor 24, to a control terminal of the amplifier transistor 20 and to one of the terminals of the capacitor 26. A second terminal of the reset transistor 24 is connected to a reset voltage line VRES. A first terminal of the amplifier transistor 20 is connected to a power supply voltage line VDD, and a second terminal of the amplifier transistor 20 is connected to a first terminal of the select transistor 22. The other terminal of the capacitor 26 is connected to a reference voltage line.

A row select signal line SEL extending in the row direction is provided in each row of the pixel array. Each of the row select signal lines SEL is connected to control terminals of the select transistors 22 of the pixels 10 arranged in the row direction to form a signal line common to these pixels 10. In FIG. 1, SEL(N) represents the row select signal line of the N-th row, and SEL(N+1) represents the row select signal line of the (N+1)-th row.

A reset signal line RES extending in the row direction is also provided in each row of the pixel array. Each of the reset signal lines RES is connected to control terminals of the reset transistors 24 of the pixels 10 arranged in the row direction to form a signal line common to these pixels 10. In FIG. 1, RES(N) represents the reset signal line of the N-th row, and RES(N+1) represents the reset signal line of the (N+1)-th row.

An output signal line VD extending in the column direction is arranged in each column of the pixel array. Each of the output signal lines VD is connected to second terminals of the select transistors 22 of the pixels 10 arranged in the column direction to form a signal line common to these pixels 10. In FIG. 1, VD(M) represents a vertical signal line of the M-th column, and VD(M+1) represents a vertical signal line of the (M+1)-th column. A current source 28 and an amplifier 30 that is part of a read-out circuit not illustrated are connected to each of the output signal lines VD.

A Vs voltage line Vs for supplying a reference voltage is connected to the second electrode 18 of the photoelectric conversion element 12 of each of the pixels 10. For convenience, the Vs voltage lines are indicated by signal lines extending in the row direction in FIG. 1. Vs(N) represents the Vs voltage line of the N-th row, and Vs(N+1) represents the Vs voltage line of the (N+1)-th row. However, the layout of the Vs voltage lines Vs and the connection to the pixels 10 are not limited to the example illustrated in FIG. 1.

When light enters the photoelectric conversion element 12, a charge according to the incident light amount is generated by photoelectric conversion in the photoelectric conversion element 12, and the charge is accumulated in the capacitor 26. When the charge is accumulated in the capacitor 26, the potential of one of the terminals of the capacitor 26, i.e. the potential of the control terminal of the amplifier transistor 20, becomes a potential according to the accumulated charge amount of the capacitor 26.

When a control signal pSEL is applied to the control terminal of the select transistor 22 through the row select signal line SEL to turn on the select transistor 22, the second terminal of the amplifier transistor 20 is connected to the output signal line VD through the select transistor 22. As a result, a pixel signal according to the charge amount accumulated in the capacitor 26 is output from the amplifier transistor 20 to the output signal line VD through the select transistor 22.

The reset transistor 24 is adapted to reset the potential of one of the terminals of the capacitor 26, i.e. the control terminal of the amplifier transistor 20, prior to an exposure period of the photoelectric conversion element 12. When a control signal pRES is applied to the control terminal of the reset transistor 24 through the reset signal line RES, the reset transistor 24 is turned on, and the potential of the control terminal of the amplifier transistor 20 is reset to a potential according to the reset voltage VRES.

Such a reading out operation can be sequentially performed row by row to sequentially read out pixel signals from the pixels 10 to the output signal lines VD.

A structure of the pixels 10 of the imaging device 100 according to the present embodiment will be described with reference to FIGS. 2 and 3.

MOS transistors including the amplifier transistor 20 and the select transistors 22 and the reset transistor 24 are provided in a pixel area of a semiconductor substrate 40. Of the three transistors, FIG. 2 illustrates only two transistors including the reset arranged in FIG. 2, the respective transistors are actually provided in a predetermined active region defined in a predetermined pattern by a device isolation region not illustrated. The layout of the respective transistors can be appropriately determined. Each of the transistors includes a gate electrode 42 and source/drain regions 44 and 46. The gate electrode 42 serves as a control terminal. The source/drain regions 44 and 46 serve as the first terminal and the second terminal, respectively. The capacitor 26 is a pn junction capacitor including an impurity diffused region (source/drain region 46) serving as the first terminal of the reset transistor 24.

An interlayer insulating film 48 including interconnection layers 52, 56 and 60 is provided above the semiconductor substrate 40 provided with the transistors 20, and 24 and the capacitor 26. Although FIG. 2 illustrates three-level interconnection layers 52, 56 and 60, the number of the levels of the interconnection layers is not limited to three, and the number of the levels of the interconnection layers can be appropriately increased or decreased as necessary.

In the example of FIG. 2, the interconnection layer 52 at a first level, the interconnection layer 56 at a second level, and the interconnection layer 60 at a third level are provided in the interlayer insulating film 48. The interconnection layers 52, 56 and 60 include conductive members in predetermined patterns. Contact plugs 50a are provided between the terminals of the transistors and conductive members 52a included in the interconnection layer 52 for electrical connection therebetween. Contact plugs 54a are provided between the conductive members 52a included in the interconnection layer 52 and conductive members 56a included in the interconnection layer 56 for electrical connection therebetween. Contact plugs 58a are provided between the conductive members 56a included in the interconnection layer 56 and conductive members 60a included in the interconnection layer 60 for electrical connection therebetween. In the present specification, a reference sign with only a number is used to collectively indicate the conductive members included in a specific interconnection layer. A reference sign with a combination of a number and an alphabet may be used to indicate part of the constituent elements thereof.

As illustrated in FIG. 2, the first electrode of the photoelectric conversion element 12 is formed of the interconnection layer 60 at a third level. The first electrode 14 is electrically connected to the reset transistor 24 via the contact plug 58a, the conductive member 56a included in the interconnection layer 56 at the second level, the contact plug 54a, the conductive member 52a included in the interconnection layer 52 at the first level, and the contact plug 50a. In the present specification, the first electrode may be called also a pixel electrode.

The photoelectric conversion layer 16 is provided above the pixel electrode (first electrode 14). A common electrode (second electrode 18) is provided above the photoelectric conversion layer 16. As a result, the photoelectric conversion element 12 including the first electrode 14, the photoelectric conversion layer 16 and the second electrode 18 is formed.

In this way, the photoelectric conversion element includes the first electrode 14, the photoelectric conversion layer 16 and the second electrode 18. As illustrated for example in FIG. 2, the photoelectric conversion element 12 may further include an insulating layer 62 arranged between the first electrode 14 and the photoelectric conversion layer 16, and a blocking layer 64 arranged between the photoelectric conversion layer 16 and the second electrode 18.

From the viewpoint of sufficiently increasing the width of a depletion layer to improve the photoelectric conversion efficiency, the photoelectric conversion layer 16 can be an intrinsic semiconductor. The photoelectric conversion layer 16 can be an N-type or P-type semiconductor with a low carrier concentration. The photoelectric conversion layer 16 may be a quantum dot film including a quantum dots made of a semiconductor material.

The blocking layer 64 is adapted to prevent injection of carriers of a conductivity type opposite to the signal charge, from the side of the second electrode 18. A typical example of the blocking layer 64 is a P-type or N-type semiconductor layer that is made of the semiconductor forming the photoelectric conversion layer 16.

The second electrode 18 is an electrode common to the photoelectric conversion elements 12 of the plurality of pixels 10 and is formed throughout an area including the plurality of pixels 10. In a region between the first electrodes 14 of adjacent pixels 10, the second electrode is electrically connected to the Vs voltage line 56b included in the interconnection layer 56 at the second level via a conductive member 60b included in the interconnection layer 60 at the third layer and the contact plug 58b. As illustrated in FIG. 3, the Vs voltage line 56b is arranged in a mesh or a grid in regions between the first electrodes 14 throughout the area including the plurality of pixels 10. The Vs voltage line 56b is formed by a conductive member in a predetermined pattern.

A color filter 70 and a microlens 72 corresponding to each of the pixels 10 are provided above the second electrode 18.

In this way, the imaging device 100 according to the present embodiment is a stacked imaging device including the photoelectric conversion elements 12 stacked above the semiconductor substrate 40 provided with the transistors, etc. In the stacked imaging device 100, the second electrode 18 is electrically connected to the Vs voltage line 56b formed of the interconnection layer 56 that is formed in a level lower than the first electrode 14, via the conductive member 60b provided in the same interconnection layer as the first electrode 14 and the contact plug 58b. The conductive member 60b and the contact plug 58b form a contact portion that electrically connects the second electrode 18 and the Vs voltage line 56b.

To transmit the light incident on the photoelectric conversion layer 16, the second electrode 18 is formed of a conductive oxide material, such as ITO, that is a transparent electrode material, and the sheet resistance is higher than when the second electrode 18 is formed of a metal material. Therefore, the Vs voltage line 56b is provided and electrically connected to the second electrode 18 in the imaging device 100 according to the present embodiment. The impedance of the second electrode can be reduced by providing and connecting the Vs voltage line 56b to the second electrode 18. The Vs voltage line 56b is, so to say, lining interconnection of the second electrode 18.

When the Vs voltage applied to the second electrode 18 is a constant voltage, the impedance of the second electrode 18 can be reduced to prevent the signal output difference caused by the difference in the impedance of the second electrode 18 between the center and near the periphery of the pixel array. As a result, an imaging device that can acquire an image with higher quality can be provided.

When the voltage level of the Vs voltage is changed in synchronization with the drive timing, the impedance of the second electrode 18 can be reduced to allow high-speed drive.

The Vs voltage line 56b electrically connected to the second electrode 18 is provided in a level lower than the photoelectric conversion element 12. According to the configuration, the light incident on the photoelectric conversion element 12 is not blocked by the Vs voltage line 56b, and this can prevent the reduction of the light receiving aperture ratio by the Vs voltage line 56b. More specifically, the sensitivity of the incident light can be improved.

Therefore, according to the imaging device 100 according to the present embodiment, the impedance of the second electrode 18 can be reduced without sacrificing the light receiving aperture ratio of the pixels 10, and the quality of the taken image can be significantly improved.

A method of manufacturing the imaging device according to the present embodiment will be described with reference to FIGS. 4A to 5B.

First, as in a manufacturing process of a well-known semiconductor device, the amplifier transistors 20, the select transistors 22, the reset transistors 24 and the capacitors 26 are formed in the semiconductor substrate 40.

Figure 4A:
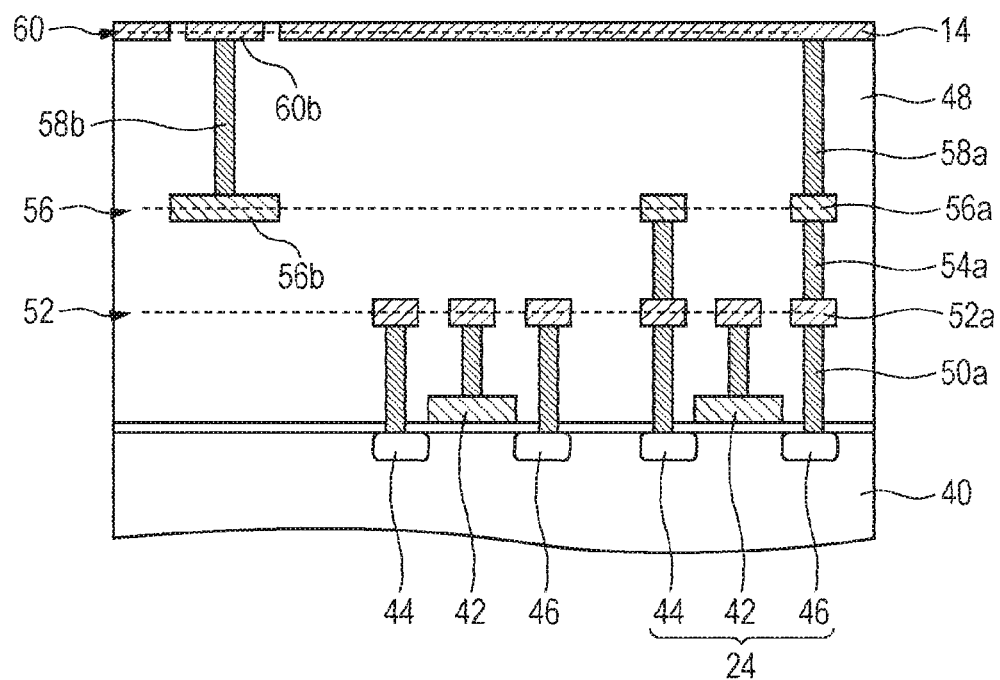

As in the well-known method of manufacturing the semiconductor devices, the interconnection layers 52, 56 and 60 and the interlayer insulating film 48 are then formed above the semiconductor substrate 40 provided with the transistors, etc. The Vs voltage line 56b formed in a mesh in the regions between the first electrodes 14 is formed in the interconnection layer 56. The first electrodes 14 of the photoelectric conversion elements 12 and the conductive members 60b electrically connected to the Vs voltage line 56b are formed in the interconnection layer 60 (FIG. 4A). The interconnection layers 52, 56 and 60 are formed at the levels lower than the photoelectric conversion elements 12. Therefore, the interconnection layers 52, 56 and 60 may be opaque to the light received by the photoelectric conversion elements 12 and can be formed by a metal material with a lower resistance than a transparent electrode material.

Figure 4B:
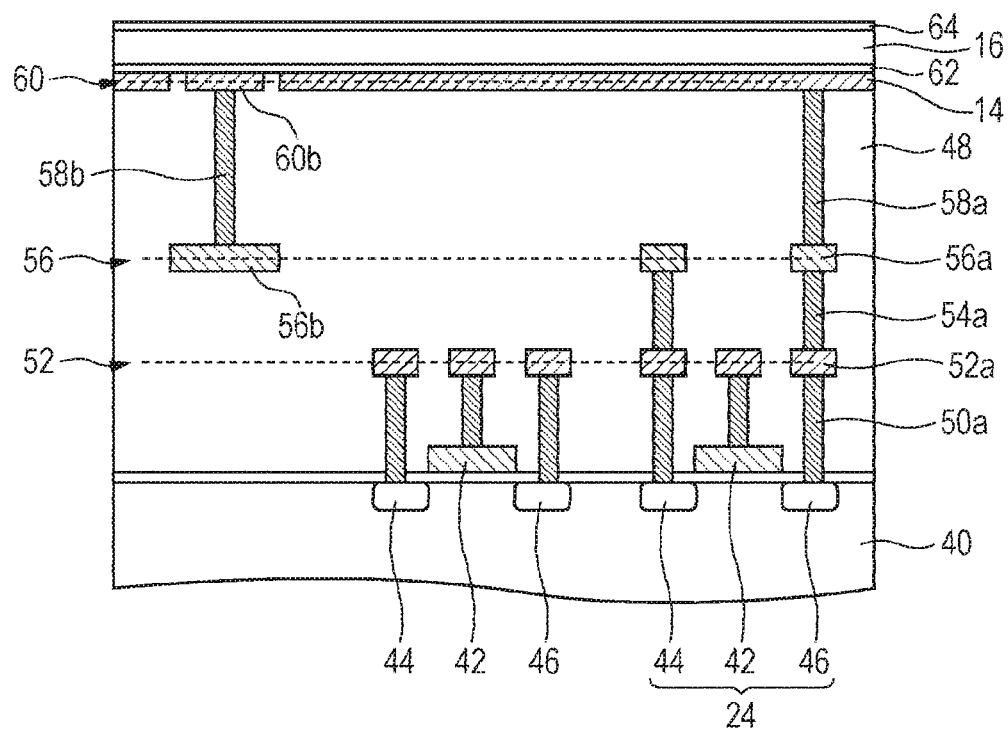

The insulating layer 62, the photoelectric conversion layer 16 and the blocking layer 64 are sequentially formed over the entire surface of the interlayer insulating film 48 in which the first electrodes 14 and the conductive members 60b are formed (FIG. 4B).

The blocking layer 64, the photoelectric conversion layer 16 and the insulating layer 62 are patterned to remove the blocking layer 64, the photoelectric conversion layer 16 and the insulating layer 62 at least over the conductive members 60b.

An insulating layer 66 is buried in the parts where the blocking layer 64, the photoelectric conversion layer 16 and the insulating layer 62 are removed (FIG. 5A).

The insulating layer 66 is patterned to form, in the insulating layer 66, openings 68 reaching the conductive members 60b.

A transparent electrode material of, e.g., conductive oxide, such as ITO, is deposited over the entire surface, and patterning is performed as necessary to form the second electrode 18. The second electrode 18 is electrically connected to the conductive members 60b through the openings 68 and are further connected to the Vs voltage line 56b via the contact plugs 58b (FIG. 5B). A conductive member, such as a contact plug (not illustrated) may be formed in the opening 68, and the second electrode 18 may be electrically connected to the conductive member 60b via the conductive member.

In this way, the photoelectric conversion elements 12 each including the first electrode 14, the insulating layer 62, the photoelectric conversion layer 16, the blocking layer 64 and the second electrode 18 are formed.

The color filters 70 and the microlenses 72 are formed above the second electrode 18 to complete the imaging device 100 according to the present embodiment.

In this way, according to the present embodiment, the lining interconnection layer electrically connected to the second electrode 18 is formed at a level lower than the photoelectric conversion element 12, and the impedance of the second electrode 18 can be reduced without reducing the light receiving aperture ratio. This can realize a high-quality imaging device in which the signal output difference between near the center and near the periphery of the imaging region caused by the impedance of the second electrode 18 is reduced.

Although the embodiment has illustrated an example in which one contact portion between the second electrode 18 and the Vs voltage line 56b is arranged in the region between two adjacent first electrodes 14, the place of arranging the contact portion is not limited to this. For example, a plurality of contact portions may be arranged in the region between two adjacent first electrodes 14. The regions for arranging the contact portions may be one or both of between adjacent pixels 10 in the row direction and between adjacent pixels 10 in the column direction. The contact portion may be arranged in a region where the corners of the first electrodes 14 of four pixels 10 opposed to each other. The contact portions may be arranged between all rows or columns of the pixels 10 or may be arranged for every m rows, every n columns or every m rows and n columns (m and n are natural numbers).

The contact portions do not always have to be arranged only in the pixel region, but may be arranged in a peripheral region around the pixel region. In this case, the second electrode 18 is extended from the pixel region to the peripheral region and connected to the interconnection layer provided with the same voltage as the Vs voltage.

Although the Vs voltage line 56b electrically connected to the second electrode 18 is formed of the interconnection layer 56 that is one layer below the interconnection layer 60 that forms the first electrodes 14 in the embodiment, the Vs voltage line 56b may be formed by the interconnection layer 52 that is a layer further below or by another interconnection layer. The Vs voltage line may be formed only in one interconnection layer or may be formed in a plurality of interconnection layers.

The second electrode 18 do not always have to be connected to the interconnection layer formed above the semiconductor substrate 40, but may be connected to another interconnection layer. For example, the second electrode 18 may be connected to Vs voltage line formed on a package substrate provided with the semiconductor substrate 40 or may be separately connected to a power supply that supplies the same voltage from different interconnection.

In any of the cases, the impedance of the second electrode 18 can be reduced by providing the Vs voltage line 56b, and the advantageous effect described in the present embodiment can be attained. These configurations can also be applied to second to fourth embodiments described later.

Second Embodiment

Figure 6:
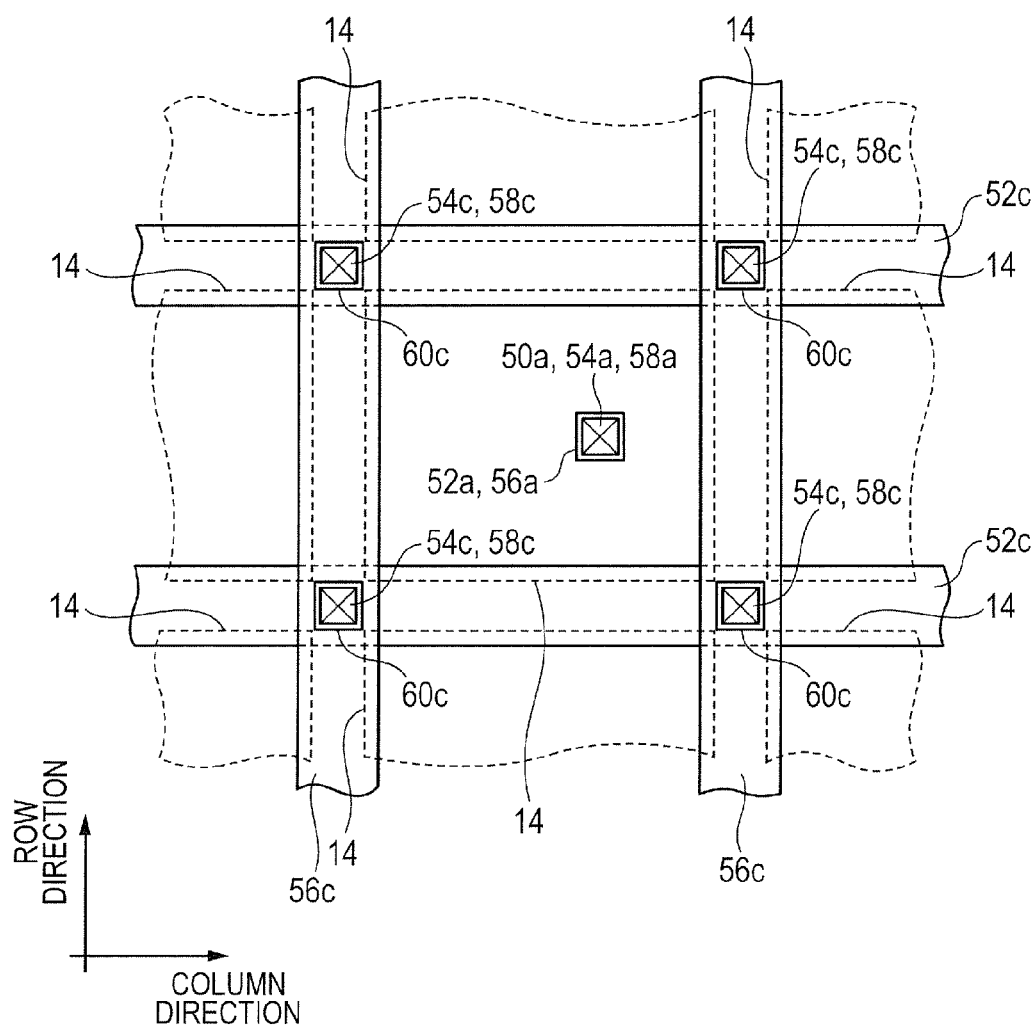
FIG. 6 is a plan view schematically illustrating a structure of an imaging device according to a second embodiment of the present invention.

An imaging device according to a second embodiment of the present invention will be described with reference to FIG. 6. FIG. 6 is a plan view illustrating a structure of the imaging device according to the present embodiment. The same constituent elements as those of the imaging device according to the first embodiment illustrated in FIGS. 1 to 5B are designated with the same reference signs, and the description will be omitted or simplified.

In the imaging device 100 according to the present embodiment, the Vs voltage line connected to the second electrode 18 is formed of two interconnection layers formed at different levels. More specifically, Vs voltage line 56c in a stripe pattern extending in a first direction is formed of the interconnection layer 56 as illustrated in FIG. 6. Vs voltage line 52c in a stripe pattern extending in a second direction intersecting the first direction is formed of the interconnection layer 52. Here, the first direction is the row direction, and the second direction is the column direction. The Vs voltage line 56c and the Vs voltage line 52c are formed of conductive members in predetermined patterns.

The Vs voltage line 56c is electrically connected to the second electrode 18 via contact plugs 58c and conductive members 60c arranged in regions where the corners of the first electrodes 14 of four pixels 10 opposed to each other. The Vs voltage line 52c is electrically connected to the Vs voltage line 56c via contact plugs 54c arranged in regions where the corners of the first electrodes 14 of four pixels 10 opposed to each other. The Vs voltage line 52c is further electrically connected to the second electrode 18 via the contact plugs 58c and the conductive members 60c. The contact plugs 58c and the conductive members 60c form contact portions that electrically connect the second electrode 18 and the Vs voltage line 56c. The contact plugs 54c form contact portions that electrically connect the Vs voltage line 56c and the Vs voltage line 52c.

The impedance of the second electrode 18 can be reduced as in the first embodiment when the Vs voltage line is formed of a plurality of interconnection layers.

The mesh-shaped Vs voltage line 56b formed of the interconnection layer 56 is provided in the imaging device 100 according to the first embodiment, and forming other control signal lines and power supply lines by the interconnection layer 56 is difficult if the Vs voltage line 56b is formed throughout the entire pixel region. In the imaging device 100 according to the present embodiment, other interconnections extending in the column direction can also be formed in the interconnection layer 52, in addition to the Vs voltage line 52b. Similarly, other interconnections extending in the row direction can also be formed in the interconnections layer 56, in addition to the Vs voltage line 56c. As a result, the degree of freedom of the layout of interconnections can be improved compared to the imaging device according to the first embodiment.

In this way, according to the present embodiment, the lining interconnection layer electrically connected to the second electrode 18 is formed at a level lower than the photoelectric conversion elements 12, and the impedance of the second electrode 18 can be reduced without reducing the light receiving aperture ratio. This can realize a high-quality imaging device in which the signal output difference between near the center and near the periphery of the imaging region caused by the impedance of the second electrode 18 is reduced. The degree of freedom of the layout of interconnections can also be improved by forming the lining interconnection layer by a plurality of different interconnection layers.

Third Embodiment

Figure 7:
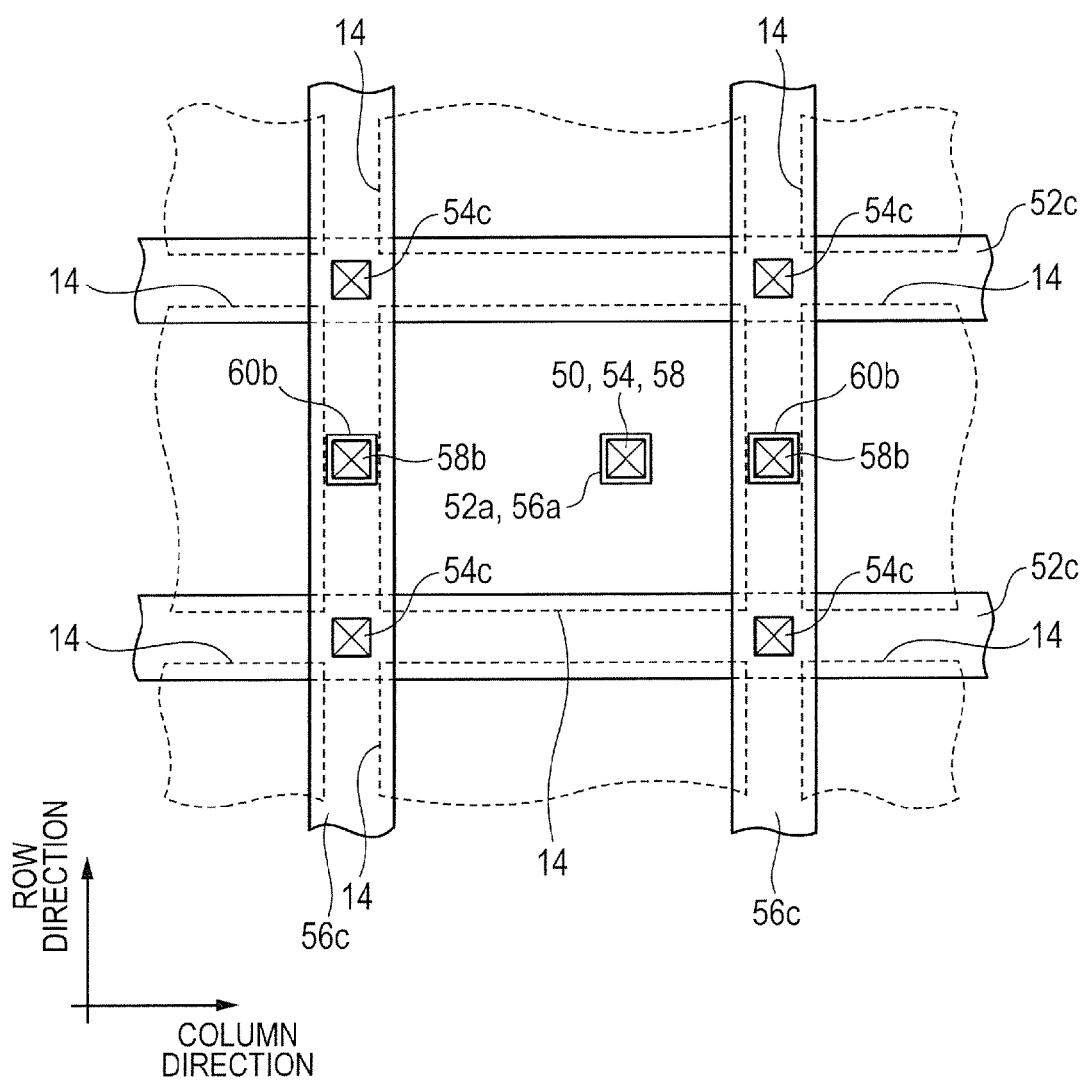
FIG. 7 is a plan view schematically illustrating a structure of an imaging device according to a third embodiment of the present invention.

An imaging device according to a third embodiment of the present invention will be described with reference to FIG. 7. FIG. 7 is a plan view illustrating a structure of the imaging device according to the present embodiment. The same constituent elements as those of the imaging device according to the first and second embodiments illustrated in FIGS. 1 to 6 are designated with the same reference signs, and the description will be omitted or simplified.

As in the second embodiment, the imaging device according to the present embodiment includes the Vs voltage line formed of the Vs voltage line 52c in a stripe pattern extending in the column direction and the Vs voltage line 56c in a stripe pattern extending in the row direction. The imaging device according to the present embodiment is different from the imaging device according to the second embodiment in that the contact portions of the Vs voltage line 52c, the voltage line 56c and the second electrode 18 are arranged in different places.

More specifically, the Vs voltage line 56c is electrically connected to the second electrode 18 via the contact plugs 58b and the conductive members 60b in regions between two adjacent first electrodes 14 as illustrated in FIG. 7. The Vs voltage line 52c is electrically connected to the Vs voltage line 56c via the contact plugs 54c arranged in regions where the corners of four first electrodes 14 opposed to each other and is further electrically connected to the second electrode 18 via the contact plugs 58b and the conductive members 60b.

The impedance of the second electrode 18 can be reduced as in the first and second embodiments when the contact plugs 54c, the contact plugs 58b and the conductive members 60b are arranged in different places. As in the second embodiment, the degree of freedom of the layout of interconnections can be improved.

In this way, according to the present embodiment, the lining interconnection layer electrically connected to the second electrode 18 is formed at a level lower than the photoelectric conversion elements 12, and the impedance of the second electrode 18 can be reduced without reducing the light receiving aperture ratio. This can realize a high-quality imaging device in which the signal output difference between near the center and near the periphery of the imaging region caused by the impedance of the second electrode 18 is reduced. The degree of freedom of the layout of interconnections can also be improved by forming the lining interconnection layer by a plurality of different interconnection layers.

Although the Vs voltage line 52c is electrically connected to the second electrode 18 via the Vs voltage line 56c in the second and the third embodiments, the Vs voltage line 52c may be electrically connected to the second electrode 18 without the Vs voltage line 56c.

The places and the number of contact portions of the Vs voltage line 52c, the Vs voltage line 56c and the second electrode 18 can be appropriately changed as described in the first embodiment. The same applies to the pitch of arranging the contact portions.

Although the Vs voltage line 52c in a stripe pattern extending in the column direction and the Vs voltage line 56c in a stripe pattern extending in the row direction are used in the second and the third embodiments, the arrangement may be opposite. More specifically, the Vs voltage line 52c in a stripe pattern extending in the row direction and the Vs voltage line 56c in a stripe pattern extending in the column direction may be used. Another interconnection layer(s) may also be arranged between the interconnection layer including the Vs voltage line in a stripe pattern extending in the row direction and the interconnection layer including the Vs voltage line in a stripe pattern extending in the column direction.

Although the Vs voltage line is formed by two interconnection layers in the second and the third embodiments, the Vs voltage line may be formed of three or more interconnection layers.

Fourth Embodiment

Figure 8:
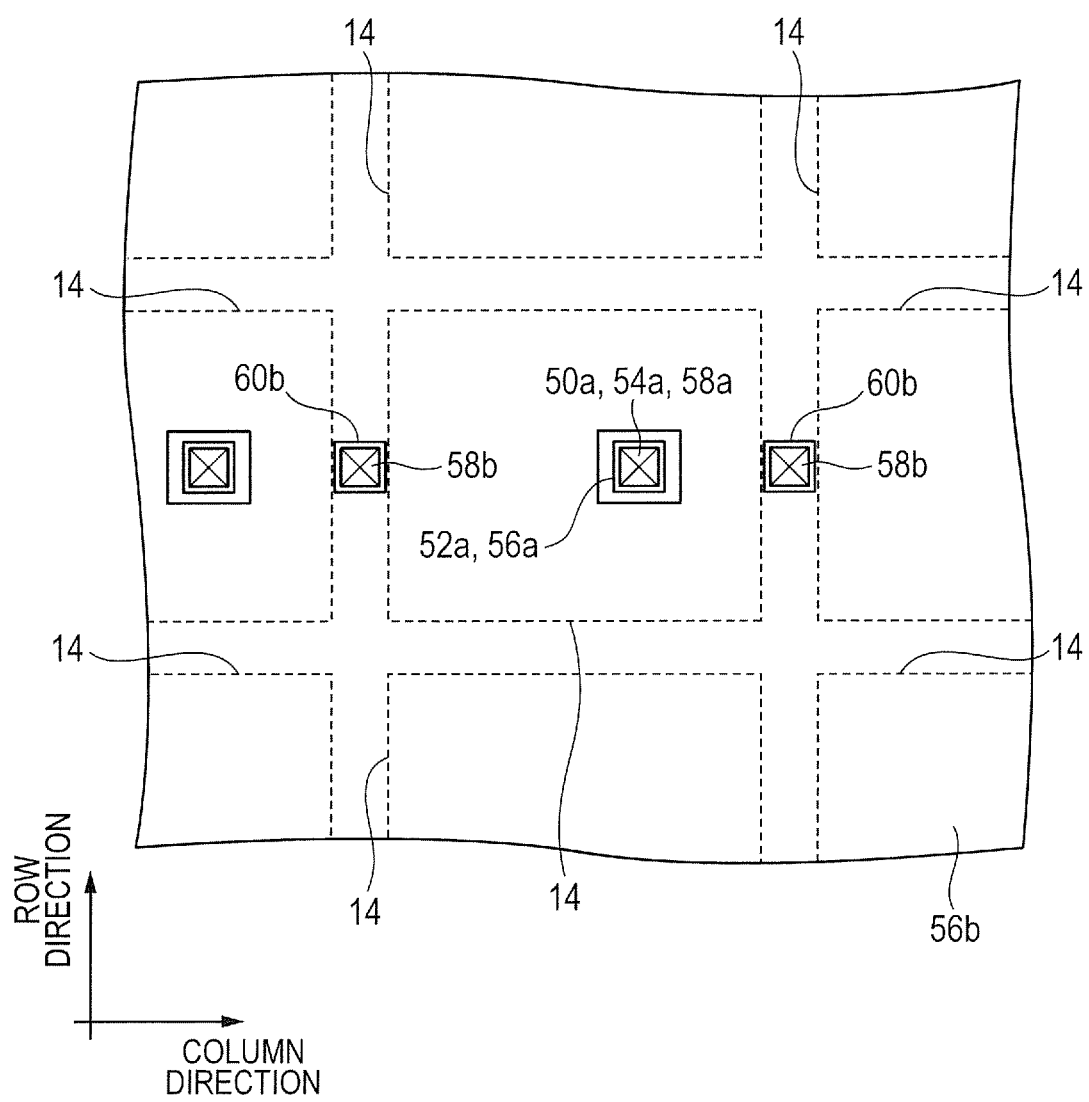
FIG. 8 is a plan view schematically illustrating a structure of an imaging device according to a fourth embodiment of the present invention.

An imaging device according to a fourth embodiment of the present invention will be described with reference to FIG. 8. FIG. 8 is a plan view illustrating a structure of the imaging device according to the present embodiment. The same constituent elements as those of the imaging device according to the first to the third embodiments illustrated in FIGS. 1 to 7 are designated with the same reference signs, and the description will be omitted or simplified.

The Vs voltage line is arranged in the regions between the first electrodes 14 in the imaging device according to the first to third embodiments, and this is because the contact portions between the second electrode and the Vs voltage line need to be arranged in the regions between the first electrodes 14.

However, the descriptions of the first to the third embodiments do not prevent extension of the Vs voltage line to regions below the pixel electrodes (first electrodes 14). The Vs voltage line only needs to be arranged in the regions between the first electrodes 14 at least in parts where the contact portions between the second electrode 18 and the Vs voltage line are formed, and the Vs voltage line can be freely laid out without preventing the functions and arrangement of other interconnections. More specifically, the vertical projection of the conductive members included in the Vs voltage line on a plane parallel to the surface of the semiconductor substrate 40 may partially overlap the vertical projection of the first electrode 14 on the plane. The Vs voltage line described in the first to the third embodiments does not affect the light incident on the photoelectric conversion elements 12, and the light receiving aperture ratio is not reduced even when the Vs voltage line overlaps the regions of the first electrodes 14.

For example, in the imaging device according to the first embodiment, the Vs voltage line 56b can be a solid pattern except for the contact portions that electrically connect the first electrodes 14 and the reset transistors 24 as illustrated for example in FIG. 8. As a result, the impedance of the second electrode 18 can be further reduced.

In this way, according to the present embodiment, the lining interconnection layer connected to the second electrode 18 is formed at a level lower than the photoelectric conversion elements 12, and the impedance of the second electrode 18 can be reduced without reducing the light receiving aperture ratio. This can realize a high-quality imaging device in which the signal output difference between near the center and near the periphery of the imaging area can be reduced.

Fifth Embodiment

Figure 9:
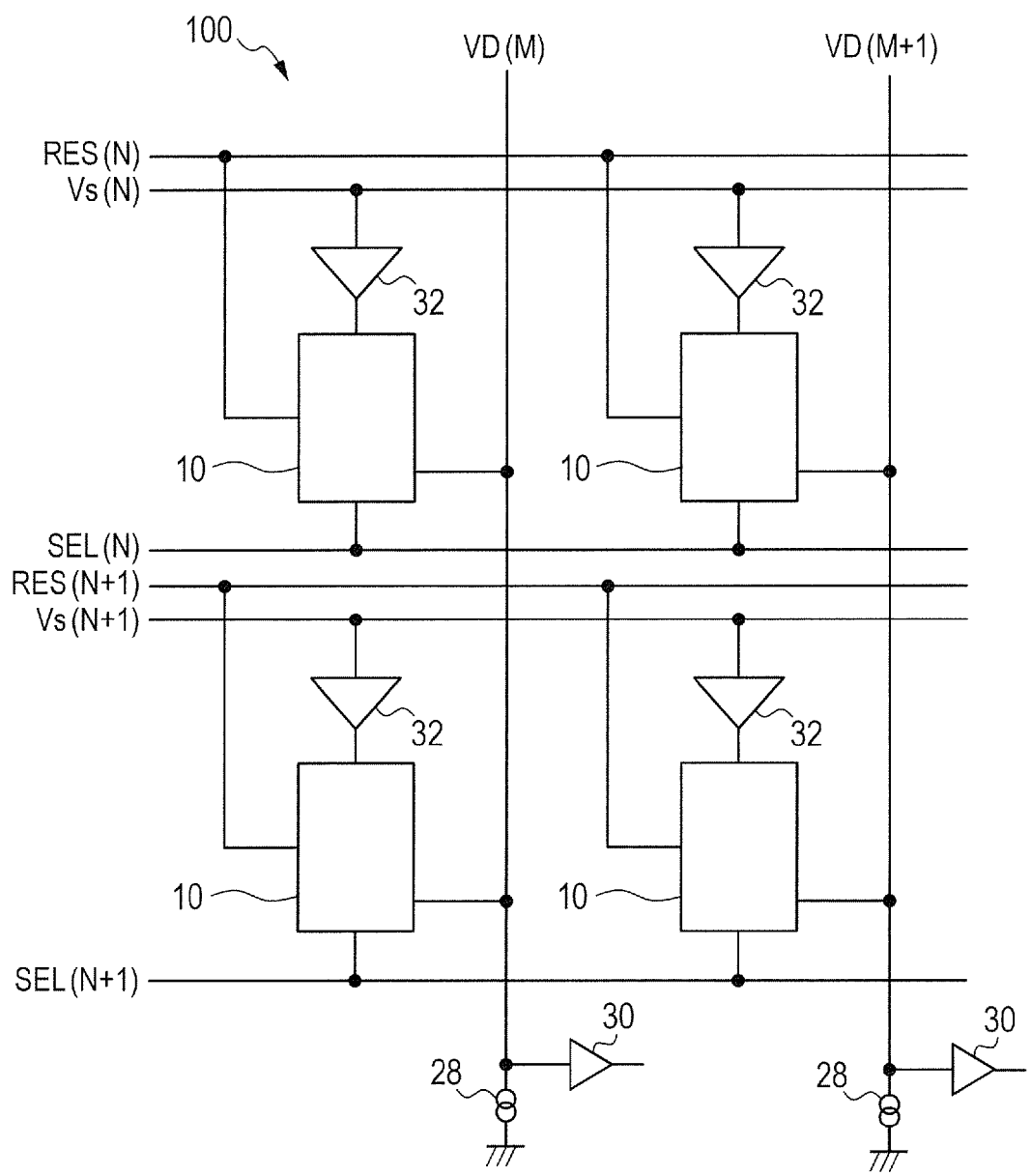
FIG. 9 is a circuit diagram illustrating a pixel configuration of an imaging device according to a fifth embodiment of the present invention.

An imaging device according to a fifth embodiment of the present invention will be described with reference to FIG. 9. FIG. 9 is a circuit diagram illustrating a pixel configuration of the imaging device according to the present embodiment. The same constituent elements as those of the imaging device according to the first to the fourth embodiments illustrated in FIGS. 1 to 8 are designated with the same reference signs, and the description will be omitted or simplified.

As illustrated in FIG. 9, the imaging device according to the present embodiment further includes amplifier circuits 32 that amplify the Vs voltage, provided between the second electrode 18 of the photoelectric conversion element 12 of each of the pixel 10 and the Vs voltage line Vs. The amplifier circuits 32 are formed on, for example, the semiconductor substrate 40, and the output terminals thereof are connected to the second electrodes 18 via the contact plugs 58b and the conductive members 60b. Like the first electrodes 14, the second electrodes 18 are patterned for each of the pixels 10, and the second electrodes 18 of adjacent pixels 10 are electrically isolated.

In the imaging device according to the present embodiment, the voltage of the Vs voltage lines is input to the amplifier circuits 32 to set the output voltage. More specifically, the current does not ideally flow to input terminals of the amplifier circuits 32, and the voltages of the Vs voltage lines near the center and near the periphery of the imaging region are the same. The amplifier circuits 32 have an ability to drive the second electrodes 18 of the pixels to maintain constant potential of the second electrodes 18. This state is a state in which the impedance of the second electrodes 18 is reduced.

In this way, the impedance of the second electrodes 18 can be reduced. As a result, the image quality can be improved.

Although the present embodiment has described the configuration in which the amplifier circuit 32 that amplifies the Vs voltage is provided for each pixel 10, the amplifier circuit 32 does not always have to be provided for each pixel 10. For example, one amplifier circuit 32 may be provided for each row or each column. In this case, the second electrodes 18 are not common to all pixels 10, but are common to each row or each column.

In this way, according to the present embodiment, the amplifier circuit 32 is connected to the second electrode 18 of the photoelectric conversion element 12 of each of the pixels 10, and a reference voltage is supplied to the second electrode 18 via the amplifier circuit 32. Therefore, the impedance of the second electrode 18 can be reduced. This can realize a high-quality imaging device in which the signal output difference between near the center and near the periphery of the imaging region can be reduced.

Sixth Embodiment

Figure 10:
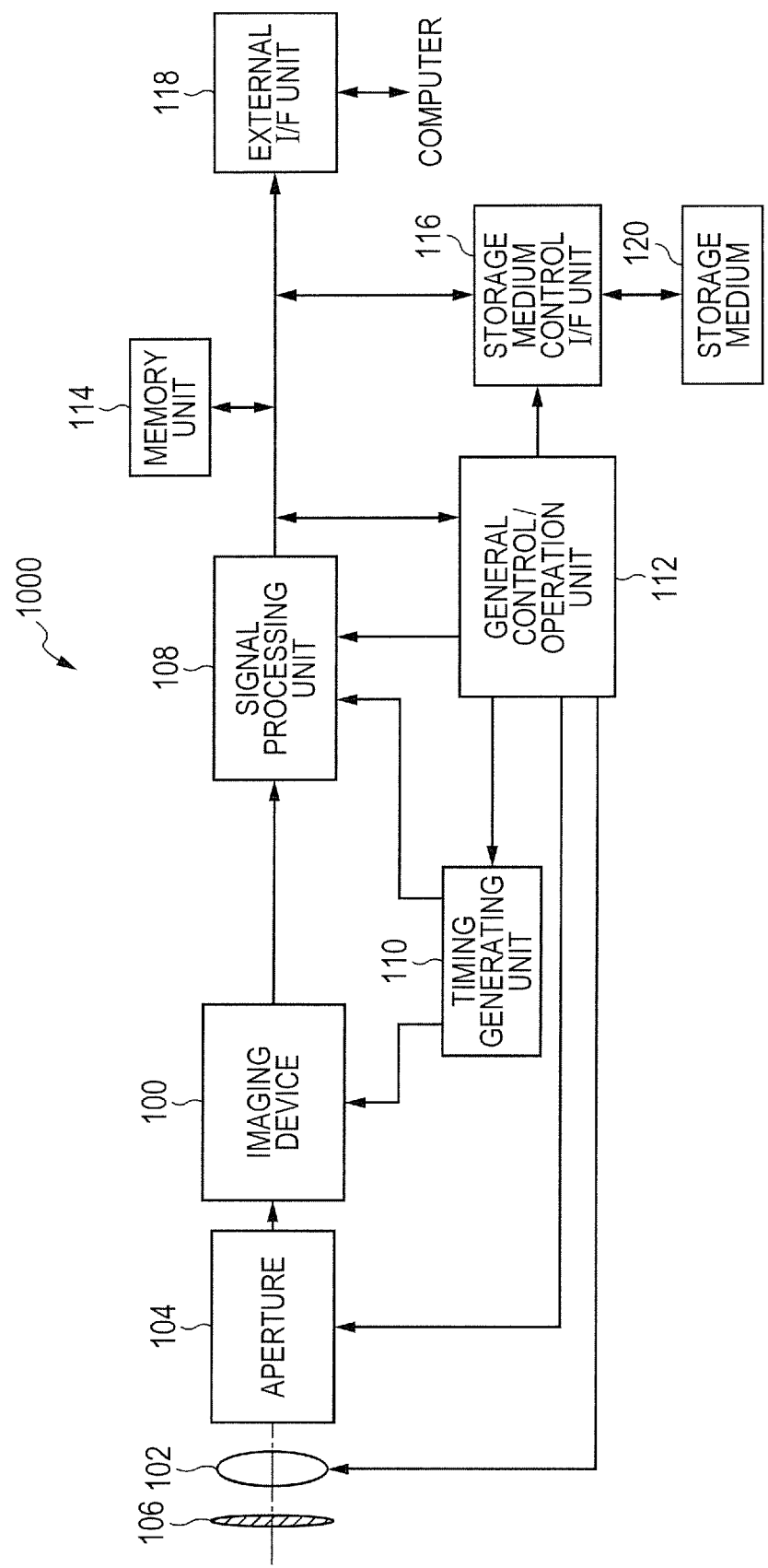
FIG. 10 is a block diagram illustrating a configuration of an imaging system according to a sixth embodiment of the present invention.

An imaging system according to a sixth embodiment of the present invention will be described with reference to FIG. 10. FIG. 10 is a schematic view illustrating a configuration example of the imaging system according to the present embodiment. The same constituent elements as those of the imaging devices according to the first to fifth embodiments illustrated in FIGS. 1 to 9 are designated with the same reference signs, and the description will be omitted or simplified.

An imaging system 1000 according to the present embodiment is not particularly limited, and for example, the imaging system 1000 can be applied to a digital still camera, a digital camcorder, a camera head, a copying machine, a facsimile, a mobile phone, an in-vehicle camera and an observation satellite, etc.

The imaging system 1000 includes the imaging device 100, a lens 102, an aperture 104, a barrier 106, a signal processing unit 108, a timing generating unit 110, a general control/operation unit 112, a memory unit 114, a storage medium control I/F unit 116 and an external I/F unit 116.

The lens 102 is adapted to form an optical image of a subject on the imaging device 100. The aperture 104 is adapted to change the amount of light passing through the lens 102. The barrier 106 is adapted to protect the lens 102. The imaging device 100 is the imaging device 100 described in the previous embodiments and is adapted to convert the optical image formed by the lens 102 into image data.

The signal processing unit 108 is a unit that applies various corrections to image data output by the imaging device 100 and that compresses the data. An AD converter for AD conversion of the image data may be mounted on the same substrate as the imaging device 100 or may be mounted on a different substrate. The signal processing unit 108 may also be mounted on the same substrate as the imaging device 100 or may be mounted on a different substrate. The timing generating unit 110 is adapted to output various timing signals to the imaging device 100 and the signal processing unit 108. The general control/operation unit 112 is a unit that controls the entire imaging system. The timing signals and the like may be input from the outside of the imaging system 1000, and the imaging system only needs to include at least the imaging device 100 and the signal processing unit 108 that processes imaging signals output from the imaging device 100.

The memory unit 114 is a frame memory unit for temporarily storing image data. The storage medium control I/F unit 116 is an interface unit for storing in the storage medium 120 or reading from the storage medium 120. The external I/F unit 118 is an interface unit for communication with an external computer or the like. The storage medium 120 is a removable storage medium, such as a semiconductor memory, for storing or reading imaging data.

Each of the pixels 10 of the imaging device 100 may include two photoelectric conversion units (for example, first photoelectric conversion unit and second photoelectric conversion unit). In this case, the signal processing unit 108 may process a signal based on the charge generated by the first photoelectric conversion unit and a signal based on the charge generated by the second photoelectric conversion unit and may acquire distance information from the imaging device 100 to the subject.

In this way, the configuration of the imaging system applying the imaging device according to the first to fifth embodiments can realize a high-performance imaging system in which the signal output difference between near the center and near the periphery of the imaging region is reduced.

Modified Embodiments

The present invention is not limited to the above-described embodiments, and various modifications can be made.

For example, although the same voltage is applied to the second electrodes 18 of all pixels 10 in the first to fourth embodiments, the same voltage does not always have to be applied to all pixels 10 at the same time. For example, a plurality of pixels 10 of a pixel array may be divided into a plurality of groups, and the voltage may be applied to the second electrodes 18 of the pixels 10 belonging to each group. For example, the second electrodes 18 can be divided for each row, for each column, for every plurality of rows or for every plurality of columns of the pixel array, and the Vs voltage can be independently applied to each of the divided second electrodes 18. In this case, the Vs voltage line can also be divided according to the division of the second electrodes.

Although an example of the pixel 10 with a pixel read-out circuit including three transistors (the amplifier transistor 20, the select transistor 22 and the reset transistor 24) has been described in the first to fifth embodiments, the configuration of the pixel read-out circuit is not limited to this. For example, the number of transistors included in the pixel read-out circuit may be four or more. Two or more photoelectric conversion elements 12 may be arranged for each of the pixels 10. To form the pixels 10 of a pupil division system, one microlens 72 can be arranged for a plurality of photoelectric conversion elements 12 included in one pixel 10.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-154431, filed Jul. 30, 2014, which is hereby incorporated by reference herein in its entirety.

What is claimed is:

1. An imaging device comprising:
a semiconductor substrate;
a plurality of pixels, each of the plurality of pixels including a transistor arranged in a pixel region of the semiconductor substrate and a photoelectric conversion element including a first electrode provided above the semiconductor substrate, a second electrode provided above the first electrode and a photoelectric conversion layer provided between the first electrode and the second electrode;
a conductive member included in an interconnection layer provided between the semiconductor substrate and the first electrode; and
a contact portion provided in the pixel region, the contact portion connecting the second electrode and the conductive member.

2. The imaging device according to claim 1, wherein each of the plurality of pixels includes a microlens provided above the second electrode.

3. The imaging device according to claim 2, wherein each of the plurality of pixels includes a color filter provided between the second electrode and the microlens.

4. The imaging device according to claim 3 further comprising:
a plurality of output lines included in a second interconnection layer different from the interconnection layer, wherein
the plurality of pixels is arranged in a matrix including a plurality of rows and a plurality of columns, and
the plurality of output lines are provided correspondingly to the plurality of columns.

5. The imaging device according to claim 4, wherein the transistor outputs a pixel signal based on charge generated in the photoelectric conversion element to one of the plurality of output lines.

6. The imaging device according to claim 5, wherein the conductive member has a shape of a mesh or a grid in a planar view of the semiconductor substrate.

7. The imaging device according to claim 6, wherein the contact portion is provided at least one for each of the plurality of pixels.

8. The imaging device according to claim 6, wherein the contact portion is provided for every m rows and/or every n columns of the plurality of pixels, wherein m and n are natural numbers.

9. The imaging device according to claim 6, further comprising:
a second contact portion provided in a peripheral region provided next to the pixel region, the second contact portion connecting the second electrode and a second conductive member included in the interconnection layer.

10. The imaging device according to claim 9, wherein second electrode is a common electrode common to the plurality of pixels.

11. The imaging device according to claim 9, wherein the plurality of pixels is divided into a plurality of groups, and
the second electrode as a common electrode and the interconnection layer are provided for each of the plurality of groups.

12. The imaging device according to claim 1, wherein the photoelectric conversion layer includes a quantum dot.

13. An imaging system comprising:
an imaging device including
a semiconductor substrate,
a plurality of pixels, each of the plurality of pixels including a transistor arranged in a pixel region of the semiconductor substrate and a photoelectric conversion element including a first electrode provided above the semiconductor substrate, a second electrode provided above the first electrode and a photoelectric conversion layer provided between the first electrode and the second electrode, a conductive member included in an interconnection layer provided between the substrate and the first electrode, and a contact portion provided in the pixel region, the contact portion connecting the second electrode and the conductive member; and a signal processing device configured to process a signal from the imaging device.

14. The imaging system according to claim 13, wherein each of the plurality of pixels includes a microlens provided above the second electrode.

15. The imaging system according to claim 14, wherein each of the plurality of pixels includes a color filter provided between the second electrode and the microlens.

16. The imaging system according to claim 15, wherein the imaging device further comprises a plurality of output lines included in a second interconnection layer different from the interconnection layer, the plurality of pixels is arranged in a matrix including a plurality of rows and a plurality of columns, and the plurality of output lines are provided correspondingly to the plurality of columns.

17. The imaging system according to claim 16, wherein the transistor outputs a pixel signal based on charge generated in the photoelectric conversion element to one of the plurality of output lines.

18. The imaging system according to claim 17, wherein the conductive member has a shape of a mesh or a grid in a planar view of the semiconductor substrate.

19. The imaging system according to claim 18, wherein the contact portion is provided at least one for each of the plurality of pixels.

20. The imaging system according to claim 18, wherein the contact portion is provided for every m rows and/or every n columns of the plurality of pixels, wherein m and n are natural numbers.

* * * * *